United States Patent
Kyono et al.

(10) Patent No.: US 8,405,066 B2
(45) Date of Patent: Mar. 26, 2013

(54) NITRIDE-BASED SEMICONDUCTOR LIGHT-EMITTING DEVICE

(75) Inventors: Takashi Kyono, Itami (JP); Yohei Enya, Itami (JP); Yusuke Yoshizumi, Itami (JP); Katsushi Akita, Itami (JP); Takamichi Sumitomo, Itami (JP); Masaki Ueno, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/999,987

(22) PCT Filed: Jun. 14, 2010

(86) PCT No.: PCT/JP2010/060054
§ 371 (c)(1),
(2), (4) Date: Dec. 17, 2010

(87) PCT Pub. No.: WO2011/007637
PCT Pub. Date: Jan. 20, 2011

(65) Prior Publication Data
US 2011/0227035 A1    Sep. 22, 2011

(30) Foreign Application Priority Data

Jul. 15, 2009  (JP) .................. 2009-166923
Feb. 2, 2010   (JP) .................. 2010-021307

(51) Int. Cl.
*H01L 33/04* (2010.01)
(52) U.S. Cl. ............... 257/14; 257/12; 257/13; 257/94; 257/E33.007; 438/46; 438/47; 372/39; 372/43.01; 372/44.01; 372/44.011
(58) Field of Classification Search ............ 257/12, 257/13, 14
See application file for complete search history.

(56) References Cited

U.S. PATENT DOCUMENTS

| | | | | |
|---|---|---|---|---|
| 6,735,230 | B1* | 5/2004 | Tanabe et al. | 372/43.01 |
| 7,045,808 | B2* | 5/2006 | Shibata | 257/13 |

(Continued)

FOREIGN PATENT DOCUMENTS

| | | |
|---|---|---|
| JP | 8-316528 A | 11/1996 |
| JP | 2003-347585 A | 12/2003 |

(Continued)

OTHER PUBLICATIONS

Mitsuru Funato et al., "Blue, Green, and Amber InGaN/GaN Light-Emitting Diodes on Semipolar {11-22} GaN Bulk Substrates," Japanese Journal of Applied Physics, vol. 45, No. 26, pp. L659-L662 (2006).

*Primary Examiner* — Matthew W Such
*Assistant Examiner* — William Harriston
(74) *Attorney, Agent, or Firm* — Venable LLP; Michael A. Sartori; Tamatane J. Aga

(57) ABSTRACT

A nitride-based semiconductor light-emitting device having enhanced efficiency of carrier injection to a well layer is provided. The nitride-based semiconductor light-emitting device comprises a hexagonal gallium nitride-based semiconductor substrate 5, an n-type gallium nitride-based semiconductor region 7 disposed on the principal surface S1 of the substrate 5, a light-emitting layer 11 having a single-quantum-well structure disposed on the n-type gallium nitride-based semiconductor region 7, and a p-type gallium nitride-based semiconductor region 19 disposed on the light-emitting layer 11. The light-emitting layer 11 is disposed between the n-type gallium nitride-based semiconductor region 7 and the p-type gallium nitride-based semiconductor region 19. The light-emitting layer 11 includes a well layer 15 and barrier layers 13 and 17. The well layer 15 comprises InGaN. The principal surface S1 extends along a reference plane S5 tilting from a plane perpendicular to the c-axis of the hexagonal gallium nitride-based semiconductor at a tilt angle in a range of not less than 63 degrees and not more than 80 degrees or in a range of not less than 100 degrees and not more than 117 degrees.

7 Claims, 14 Drawing Sheets

U.S. PATENT DOCUMENTS

| | | | |
|---|---|---|---|
| 7,135,716 B2 * | 11/2006 | Kim et al. | 257/103 |
| 7,315,050 B2 * | 1/2008 | Udagawa | 257/103 |
| 7,547,910 B2 | 6/2009 | Akita et al. | |
| 7,851,821 B2 * | 12/2010 | Kyono et al. | 257/101 |
| 8,207,556 B2 * | 6/2012 | Kyono et al. | 257/103 |
| 2008/0023708 A1 | 1/2008 | Akita et al. | |
| 2009/0212277 A1 * | 8/2009 | Akita et al. | 257/13 |
| 2009/0310640 A1 * | 12/2009 | Sato et al. | 372/45.011 |
| 2010/0006780 A1 * | 1/2010 | Metcalfe et al. | 250/504 R |
| 2010/0276663 A1 | 11/2010 | Enya et al. | |
| 2011/0216795 A1 * | 9/2011 | Hsu et al. | 372/44.011 |
| 2011/0243172 A1 * | 10/2011 | Lin et al. | 372/45.012 |

FOREIGN PATENT DOCUMENTS

| | | |
|---|---|---|
| JP | 2005-252294 | 9/2005 |
| JP | 2007-134507 A | 5/2007 |
| JP | 2008-060375 A | 3/2008 |
| JP | 2009-071127 A | 4/2009 |
| JP | 2009-088230 A | 4/2009 |
| JP | 4475358 B1 | 6/2010 |

* cited by examiner

Fig.2
(A)
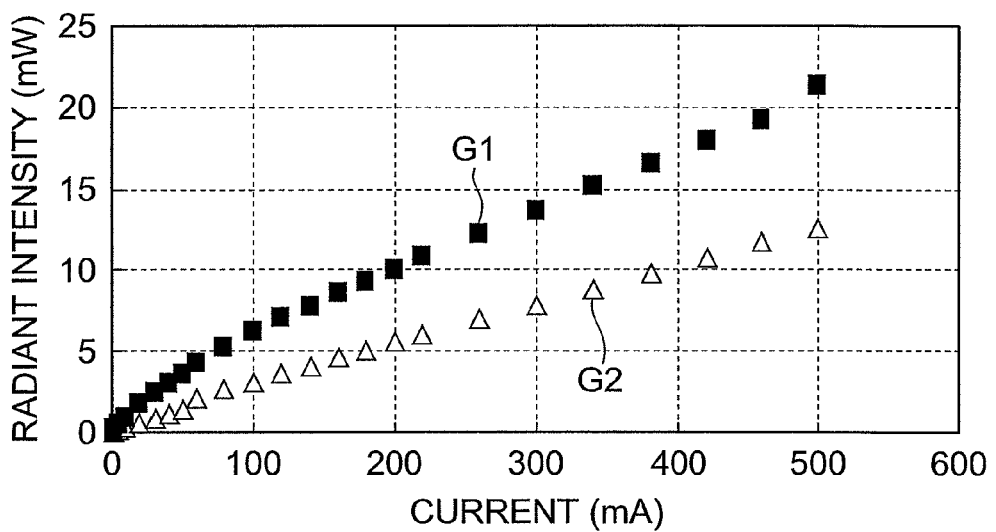
(B)
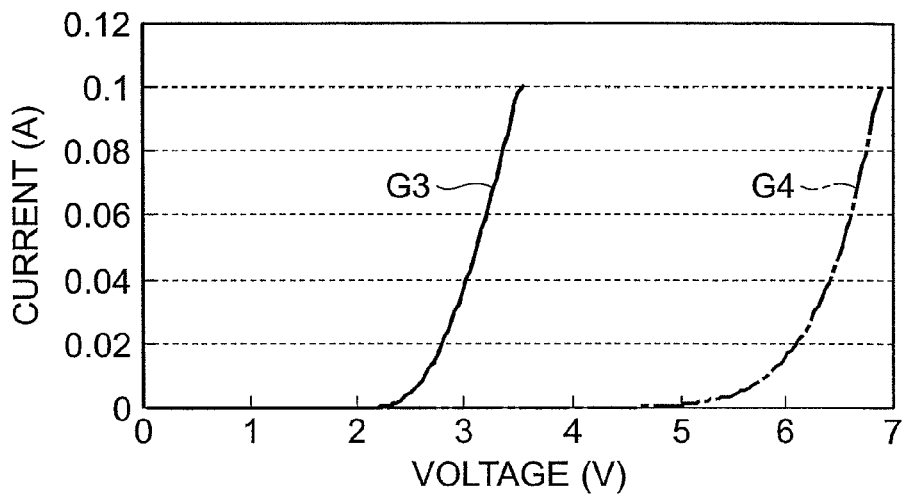

NITRIDE-BASED SEMICONDUCTOR LIGHT-EMITTING DEVICE

TECHNICAL FIELD

The present invention relates to a nitride-based semiconductor light-emitting device.

BACKGROUND ART

Each of Patent Documents 1, 2 and Non-patent document 1 discloses a nitride-based semiconductor light-emitting device that includes two nitride semiconductor layers and an active layer. The active layer has an InGaN single-quantum-well structure and is disposed between the two nitride semiconductor layers. The two nitride semiconductor layers and the active layer are disposed on a GaN substrate. The nitride semiconductor light-emitting device described in Patent Document 1 includes an n-type cladding layer of n-type nitride semiconductor, a p-type cladding layer of p-type nitride semiconductor, and an active layer of nitride semiconductor containing at least indium. The active layer is disposed between the n-type cladding layer and the p-type cladding layer. The n-type cladding layer and the p-type cladding layer have smaller coefficients of thermal expansion compared to the active layer. The active layer has a single-quantum-well structure (or multiple-quantum-well structure) and emits light having lower energy than inherent band gap energy of the nitride semiconductor of the active layer. The LED described in Patent Document 2 has an InGaN single-quantum-well structure on the {11-22} plane of a GaN substrate. The nitride semiconductor laser device described in Patent Document 3 includes a nitride semiconductor layer and an active layer. The semiconductor layer includes a layer of AlGaN. The active layer includes a layer of InGaN and is deposited on the nitride semiconductor layer. The active layer includes a single-quantum-well structure (or multiple-quantum-well structure). The growth surface of the nitride semiconductor layer tilts from a c-plane of the GaN substrate.

CITATION LIST

Patent Literature

Patent Document 1: Japanese Patent Laid-Open No. H08-316528
Patent Document 2: Japanese Patent Laid-Open No. 2009-71127

Non Patent Literature

Non-patent Document 1: "Japanese Journal of Applied Physics", Vol. 45, No. 26, 2006, pp. L659-L662

SUMMARY OF INVENTION

Technical Problem

Although long-wavelength emission of the conventional nitride semiconductor light-emitting devices is achieved by an increased indium composition in the InGaN well layer on the GaN substrate, strain in the InGaN well layer increases with the increase of the indium composition. The efficiency of carrier injection to the InGaN well layer is affected by the piezoelectric field generated by the strain in the InGaN well layer. An object of the present invention is to provide a nitride-based semiconductor light-emitting device having an enhanced efficiency of carrier injection to the well layer.

Solution to Problem

An aspect of the present invention is a nitride-based semiconductor light-emitting device. The nitride-based semiconductor light-emitting device comprises a substrate of hexagonal gallium nitride-based semiconductor; an n-type gallium nitride-based semiconductor region disposed on a principal surface of the substrate; a light-emitting layer having a single-quantum-well structure disposed on the n-type gallium nitride-based semiconductor region; and a p-type gallium nitride-based semiconductor region disposed on the light-emitting layer. The light-emitting layer is disposed between the n-type gallium nitride-based semiconductor region and the p-type gallium nitride-based semiconductor region. The light-emitting layer includes a well layer and a barrier layer. The well layer comprises InGaN. The principal surface extends along a reference plane tilting from a plane perpendicular to a c-axis of the hexagonal gallium nitride-based semiconductor at a tilt angle in a range of not less than 63 degrees and not more than 80 degrees or in a range of not less than 100 degrees and not more than 117 degrees. The direction of the piezoelectric polarization generated in the well layer is identical to the direction from the p-type gallium nitride-based semiconductor region to the n-type gallium nitride-based semiconductor region.

Since the principal surface of the substrate extends along the reference plane tilting from the plane perpendicular to the c-axis of the hexagonal gallium nitride-based semiconductor substrate at a tilt angle in a range of not less than 63 degrees and not more than 80 degrees or in a range of not less than 100 degrees and not more than 117 degrees, piezoelectric polarization generated in the well layer is reduced compared to a substrate having a principal surface perpendicular to the c-axis. Indium is successfully incorporated in this range of tilt angle, which is advantageous for a light-emitting device having a long emission wavelength in the visible range. Small piezoelectric polarization generated in a well layer leads to strain of the well structure of the light-emitting layer in the direction that carriers (electrons in particular) barely escape from the well, and the efficiency of the carrier injection (electrons in particular) to the wells decreases in proportion to the number of wells. In contrast, the well layer of the light-emitting layer has a single-quantum-well structure; hence, the efficiency of the carrier injection (electron injection in particular) to the well layer is higher than that of the multiple-quantum-well structure.

In the nitride-based semiconductor light-emitting device according to the aspect of the present invention, the difference in band gap energy between the barrier layer and the well layer is not less than 0.7 eV, and the light-emitting layer emits light having a peak wavelength in a range of not less than 450 nm and not more than 600 nm. The bather layer comprises, for example, GaN, InGaN, AlGaN, or InAlGaN. Compared to a multiple-quantum-well structure, the injection efficiency of the carriers (electrons in particular) in the light-emitting layer is more significantly enhanced due to the relatively large difference in band gap energy between the well layer and the barrier layer, which is not less than 0.7 eV. In addition, compared to the multiple-quantum-well structure, the injection efficiency of the carriers (electrons in particular) in the light-emitting layer is more significantly enhanced due to the relatively large difference in band gap energy between the well layer and the barrier layer in the case where the light-emitting layer emits light having a peak wavelength in a range of not less than 450 nm and not more than 600 nm.

The nitride-based semiconductor light-emitting device according to the aspect of the present invention further comprises an InGaN layer. The InGaN layer is disposed between the n-type gallium nitride-based semiconductor region and the light-emitting layer. A lattice constant of the InGaN layer in the direction of a first axis is larger than a lattice constant of the substrate in the direction of a second axis. A lattice constant of the InGaN layer in the direction of a third axis is equal to a lattice constant of the substrate in the direction of a fourth axis. The first axis is shared by a first interface at the substrate side of the InGaN layer and a surface being perpendicular to the first interface and including the c-axis. The second axis is shared by the principal surface and a surface being perpendicular to the principal surface and including the c-axis. The third axis is perpendicular to the first axis and the c-axis. The fourth axis is perpendicular to the second axis and the c-axis. Since the light-emitting layer is disposed on the InGaN layer, which is disposed on the principal surface and is lattice-relaxed only in the direction (parallel to the off direction) along the first axis, the strain in the well layer of the light-emitting layer is relaxed and the piezoelectric polarization is reduced. In general, a well layer in a light emitting layer having a single-quantum-well structure tends to have larger strain than that of a multiple-quantum-well structure; however, the InGaN layer is lattice-relaxed only in the direction (parallel to the off direction) along the first axis to relax the strain in the well layer of the light-emitting layer. Consequently, even in the single-quantum well layer, defects caused by lattice-mismatching in the well layer is reduced.

In the nitride-based semiconductor light-emitting device according to the aspect of the present invention, the InGaN layer includes misfit dislocations generated in the first interface. The misfit dislocations extend along the third axis and have a density in a range of not less than $5\times10^3$ cm$^{-1}$ and not more than $1\times10^5$ cm$^{-1}$. In this range, strains in the InGaN layer and a layer disposed on the InGaN layer are effectively relaxed. Since the misfit dislocations are present in the interface away from the light-emitting layer, the misfit dislocations have relatively small influence on properties of the nitride-based semiconductor light-emitting device.

In the nitride-based semiconductor light-emitting device according to the aspect of the present invention, the n-type gallium nitride-based semiconductor region includes an n-type InAlGaN layer. A lattice constant of the InAlGaN layer in the direction of a fifth axis is larger than the lattice constant of the substrate in the direction of the second axis. A lattice constant of the InAlGaN layer in the direction of a sixth axis is equal to the lattice constant of the substrate in the direction of the fourth axis. The fifth axis is shared by a second interface at the substrate side of the InAlGaN layer and a surface being perpendicular to the second interface and including the c-axis. The sixth axis is perpendicular to the fifth axis and the c-axis. Since the light-emitting layer is disposed on the InAlGaN layer, which is disposed on the principal surface and is lattice-relaxed only in the direction (parallel to the off direction) along the fifth axis, the strain in the well layer of the light-emitting layer is relaxed and the piezoelectric polarization is reduced. In general, a well layer in a light emitting layer having a single-quantum-well structure tends to have larger strain than that of a multiple-quantum-well structure; however, the InAlGaN layer is lattice-relaxed only in the direction (parallel to the off direction) along the fifth axis to relax the strain in the well layer of the light-emitting layer. Consequently, even in the single-quantum well layer, defects caused by lattice-mismatching in the well layer is reduced.

In the nitride-based semiconductor light-emitting device according to the aspect of the present invention, the InAlGaN layer includes misfit dislocations generated in the second interface. The misfit dislocations extend along the sixth axis and have a density in a range of not less than $5\times10^3$ cm$^{-1}$ and not more than $1\times10^5$ cm$^{-1}$. In this range, the strains in the InAlGaN layer and a layer disposed on the InAlGaN layer are effectively relaxed. Since the misfit dislocations are present in the second interface away from the light-emitting layer, the misfit dislocations have relatively small influence on properties of the nitride-based semiconductor light-emitting device.

Advantageous Effects of Invention

According to the present invention, a nitride-based semiconductor light-emitting device having an enhanced efficiency of carrier injection to the well layer is provided.

BRIEF DESCRIPTION OF DRAWINGS

FIG. 2 is a drawing for explaining effects of the LED according to the embodiment.

DESCRIPTION OF EMBODIMENTS

Figure 1:
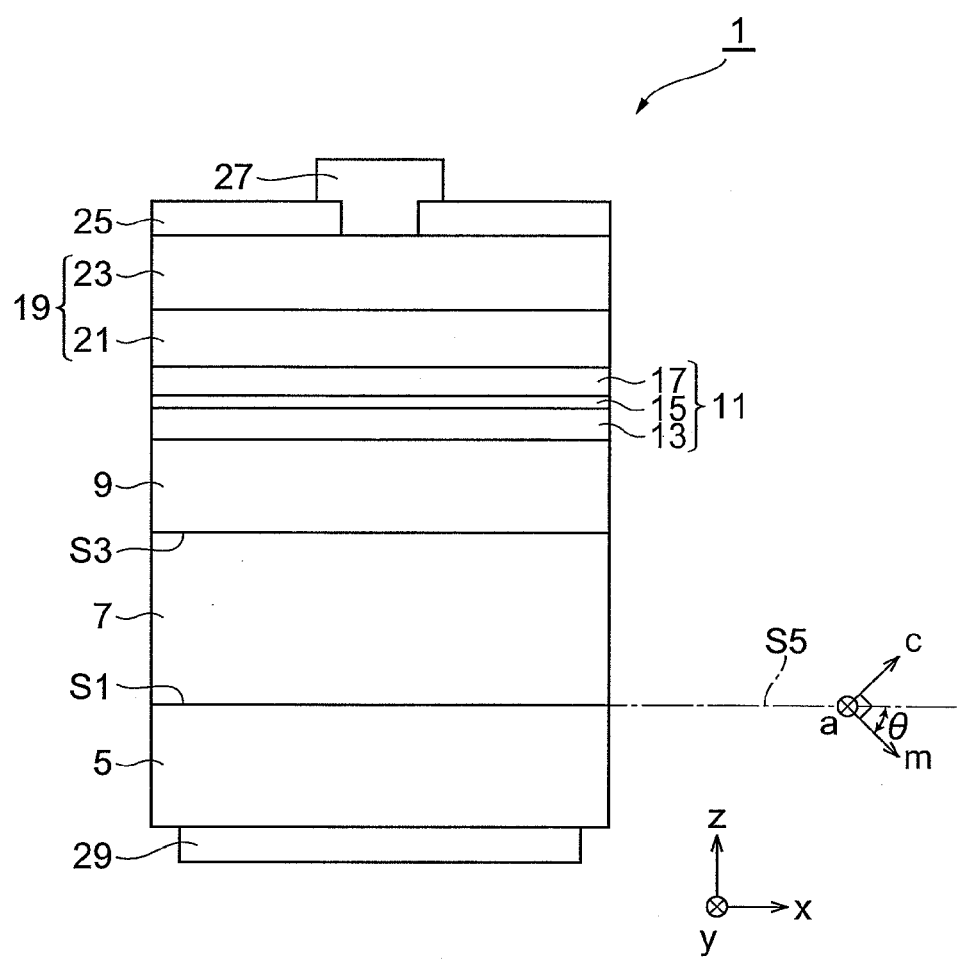
FIG. 1 is a drawing for explaining the structure of an LED according to an embodiment of the present invention.

Embodiments of the present invention will be described in details with reference to the attached drawings. The same reference numerals are designated to the same parts throughout the drawings, wherever possible, to curtail redundant description.

First Embodiment

FIG. 1 is a drawing schematically showing a structure of an LED 1 according to the first embodiment. The LED 1 is a light-emitting diode (nitride-based semiconductor light-emitting device) including an n-electrode 29, a substrate 5, an n-type gallium nitride-based semiconductor region 7, a buffer layer 9, a light-emitting layer 11, a p-type gallium nitride-based semiconductor region 19, a p-electrode 25, and a pad electrode 27, in sequence along the direction of the z-axis. The substrate 5, the n-type gallium nitride-based semiconductor region 7, the buffer layer 9, the light-emitting layer 11, and the p-type gallium nitride-based semiconductor region 19 comprise hexagonal gallium nitride-based semiconductors. A principal surface S1 of the substrate 5 extends along a plane (including the x-axis and y-axis) perpendicular to the z-axis. The principal surface S1 is a semi-polar surface extending along a reference plane S5 tilting from a plane perpendicular to the c-axis of the hexagonal gallium nitride-based semiconductor of the substrate 5 at a tilt angle θ in a range of not less than 63 degrees and not more than 80 degrees or in a range of not less than 100 degrees and not more than 117 degrees. FIG. 1 illustrates the c-axis tilting toward the m-axis as an example.

The n-type gallium nitride-based semiconductor region 7 is disposed on the principal surface S1 and is in contact with the substrate 5 at the principal surface S1. The buffer layer 9 is disposed between the n-type gallium nitride-based semiconductor region 7 and the light-emitting layer 11 and is in contact with both the n-type gallium nitride-based semiconductor region 7 and the light emitting layer 11 (barrier layer 13 in particular).

A lattice constant of the buffer layer 9 in the direction of a first axis (substantially in the direction of the x-axis) may be larger than a lattice constant of the substrate 5 in the direction of a second axis (substantially in the direction of the x-axis). A lattice constant of the buffer layer 9 in the direction of a third axis (substantially in the direction of the y-axis) may be equal to a lattice constant of the substrate 5 in the direction of a fourth axis (substantially in the direction of the y-axis). The first axis is shared by an interface S3 at the substrate 5 side of the buffer layer 9 and a surface being perpendicular to the interface S3 and including the c-axis. The second axis is shared by the principal surface S1 and a surface being perpendicular to the principal surface S1 of the substrate 5 and including the c-axis. The third axis is perpendicular to the first axis and the c-axis. The fourth axis is perpendicular to the second axis and the c-axis. (The term "lattice constant" herein is not inherent in material. Each of the substrate 5 and the buffer layer 9 provided in the LED 1 has its own lattice constant.) Since the buffer layer 9 is lattice-relaxed, the strain is released in the buffer layer 9 to reduce strain generated in a well layer 15. In this case, the buffer layer 9 includes misfit dislocations generated in the interface S3. The misfit dislocations extend in the direction of the third axis and have a density in a range of not less than $5 \times 10^3$ cm$^{-1}$ and not more than $1 \times 10^5$ cm$^{-1}$.

The light-emitting layer 11 is disposed between the n-type gallium nitride-based semiconductor region 7 and the p-type gallium nitride-based semiconductor region 19 and between the buffer layer 9 and an electron-blocking layer 21, and is in contact with both the buffer layer 9 and the electron-blocking layer 21. The light-emitting layer 11 has a single-quantum-well structure and includes a barrier layer 13, the well layer 15, and a barrier layer 17 in sequence along the direction of the z-axis on the buffer layer 9. The light-emitting layer 11 emits light having a peak wavelength in a range of not less than 450 nm and not more than 600 nm.

The barrier layer 13 is disposed between the buffer layer 9 and the well layer 15 and is in contact with both the buffer layer 9 and the well layer 15. The well layer 15 is disposed between the barrier layer 13 and the barrier layer 17 and is in contact with both the barrier layer 13 and the barrier layer 17.

The barrier layer 17 is disposed between the well layer 15 and the electron-blocking layer 21 and is in contact with both the well layer 15 and the electron-blocking layer 21. The difference in band gap energy between each barrier layer 13 or 17 and the well layer 15 is not less than 0.7 eV.

Figure 4:
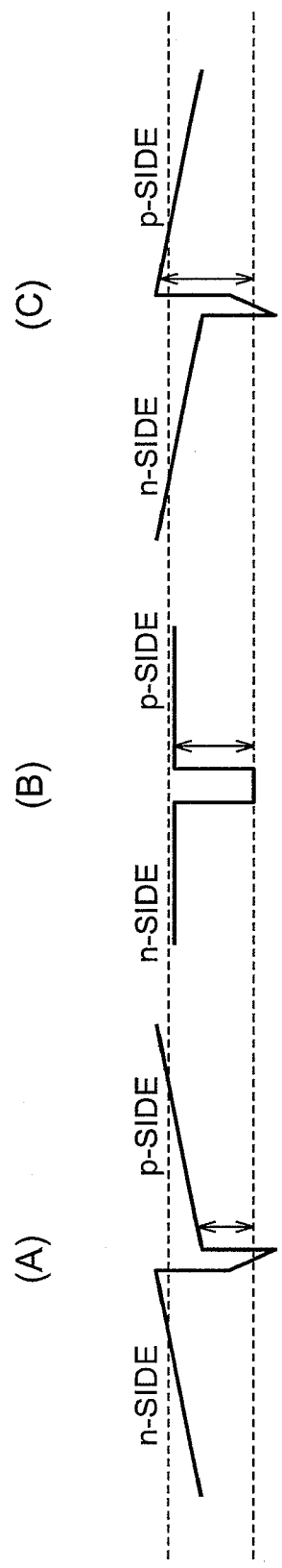
FIG. 4 is a drawing for explaining the well structures corresponding to the piezoelectric polarization states.

In the case where the principal surface S1 extends along the reference plane S5 tilting from a plane perpendicular to the c-axis of the hexagonal gallium nitride-based semiconductor of the substrate 5 at a tilt angle in a range of not less than 63 degrees and not more than 80 degrees, the piezoelectric polarization generated in the well layer 15 is negative and the direction of the piezoelectric polarization is identical to the direction from the p-type gallium nitride-based semiconductor region 19 to the n-type gallium nitride-based semiconductor region 7. In the case of negative piezoelectric polarization in the well layer 15, a greater barrier height to the well layer 15 is provided at the p-type gallium nitride-based semiconductor region 19 side as shown in Part (C) of FIG. 4 compared to the case of positive piezoelectric polarization in the well layer 15 (well structure as shown in Part (A) of FIG. 4) or zero piezoelectric polarization in the well layer 15 (well structure as shown in Part (B) of FIG. 4). Consequently, in a multiple-quantum-well structure having these wells, the efficiency of the electron injection to the well layer is reduced compared to the LED 1 having a single-well structure. Such an effect is enhanced as the barrier height to the well layer at the p-type gallium nitride-based semiconductor region 19 side increases (i.e., the emission wavelength is longer).

The p-type gallium nitride-based semiconductor region 19 includes the electron-blocking layer 21 and a contact layer 23 in sequence along the direction of the z-axis above the light-emitting layer 11. The electron-blocking layer 21 is disposed between the barrier layer 17 and the contact layer 23 and is in contact with both the barrier layer 17 and the contact layer 23. A p-electrode 25 is disposed on the p-type gallium nitride-based semiconductor region 19 (particularly on the surface of the contact layer 23) and is in contact with the contact layer 23. The p-electrode 25 has a contact hole extending through the p-electrode 25 to the surface of the contact layer 23. A pad electrode 27 is disposed on the p-electrode 25 and is in contact with the p-electrode 25. The pad electrode 27 is in contact with the contact layer 23 through the contact hole of the p-electrode 25. An n-electrode 29 is disposed on the surface, opposite to the principal surface S1, of the substrate 5, and is in contact with the substrate 5.

An exemplary LED 1 according to the first embodiment is described below. The substrate 5 comprises GaN having a semipolar principal surface S1, while the n-type gallium nitride-based semiconductor region 7 comprises n-type doped GaN. The n-type gallium nitride-based semiconductor region 7 has a thickness of about 2 μM. The buffer layer 9 comprises n-type doped InGaN. An indium composition of the buffer layer 9 is 0.02, and a gallium composition of the buffer layer 9 is 0.98. The buffer layer 9 has a thickness of about 100 nm.

Each of the barrier layers 13, 17 comprises GaN and has a thickness of about 15 nm. The well layer 15 comprises InGaN. An indium composition of the well layer 15 is 0.30, and a gallium composition of the well layer 15 is 0.70. The well layer 15 has a thickness of about 3 nm. The difference in band gap energy between the well layer 15 and the barrier layer 13 or 17 is about 1 eV.

The electron-blocking layer 21 comprises p-type doped AlGaN. An aluminum composition of the electron-blocking layer 21 is 0.18, and a gallium composition of the electron-blocking layer 21 is 0.82. The electron-blocking layer 21 has a thickness of about 20 nm. The contact layer 23 comprises p-type doped GaN and has a thickness of about 50 nm. The p-electrode 25 comprises Ni/Au, the pad electrode 27 comprises Ti/Au, and the n-electrode 29 comprises Ti/Al.

A method of making a LED 1 is described below. On a substrate 5 having a principal surface S1 that is the (20-21) plane tilting off toward the m-axis by 75 degrees, an LED structure having a band of 520 nm is made. The substrate 5 is kept in an atmosphere of $NH_3$ and $H_2$ at about 1050° C. for about 10 minutes for thermal cleaning to deposit an n-type gallium nitride-based semiconductor region 7 into a thickness of about 2 μm at about 1100° C. The atmospheric temperature is then reduced to about 840° C. to deposit a buffer layer 9 into a thickness of about 100 nm and a light-emitting layer 11 in series. Both barrier layers 13, 17 of the light-emitting layer 11 are deposited at a deposition temperature of about 840° C. into a thickness of about 15 nm, and a well layer 15 is deposited at a deposition temperature of about 740° C. into a thickness of about 3 nm. Subsequently, the atmospheric temperature is increased to about 1000° C. to deposit an electron-blocking layer 21 into a thickness of about 20 nm and a contact layer 23 into a thickness of about 50 nm in series. Subsequently, a Ni/Au p-electrode 25, a Ti/Au pad electrode 27, and a Ti/Al n-electrode 29 are made by vacuum deposition.

FIG. 2 illustrates the operation of the LED 1. The graph G1 in Part (A) of FIG. 2 shows radiant intensity versus driving current for the exemplary LED 1, while the graph G2 shows radiant intensity versus driving current for a reference LED. The configuration of the light-emitting layer of the reference LED is different from that of the exemplary LED 1, having a multiple-quantum-well structure including three wells. The other configuration of the reference LED is the same as that of the exemplary LED 1. The graphs G1, G2 show that the exemplary LED 1 having a single-quantum-well structure has higher radiant intensity compared to the reference LED having a multiple-quantum-well structure. The graph G3 in Part (B) of FIG. 2 shows driving current versus driving voltage for the exemplary LED 1, while the graph G4 shows driving current versus driving voltage for the reference LED. The graphs G3, G4 show that the exemplary LED 1 having a single-quantum-well structure has lower driving voltage compared to the reference LED having a multiple-quantum-well structure.

In the LED 1 having such a configuration, since the principal surface S1 of the substrate 5 extends along the reference plane S5 tilting from the plane perpendicular to the c-axis of the hexagonal gallium nitride-based semiconductor substrate 5 at a tilt angle θ in a range of not less than 63 degrees and not more than 80 degrees or in a range of not less than 100 degrees and not more than 117 degrees, piezoelectric polarization generated in the well layer 15 can be reduced compared to a substrate having a principal surface S1 perpendicular to the c-axis. Small piezoelectric polarization generated in the well layer 15 leads to strain of the well structure of the light-emitting layer 11 in the direction that carriers (electrons in particular) barely escape from the well, and the efficiency of the carrier injection (electrons in particular) to the wells decreases in proportion to the number of wells. In contrast, the well layer of the light-emitting layer 11 has a single-quantum-well structure; hence, the efficiency of the carrier injection (electrons in particular) to the well layer is enhanced compared to the multiple-quantum-well structure. Compared to the multiple-quantum-well structure, the injection efficiency of the carriers (electrons in particular) in the light-emitting layer 11 is significantly higher due to a relatively large difference in band gap energy, not less than 0.7 eV, between the well layer 15 and the barrier layer 13, 17.

Second Embodiment

Figure 3:
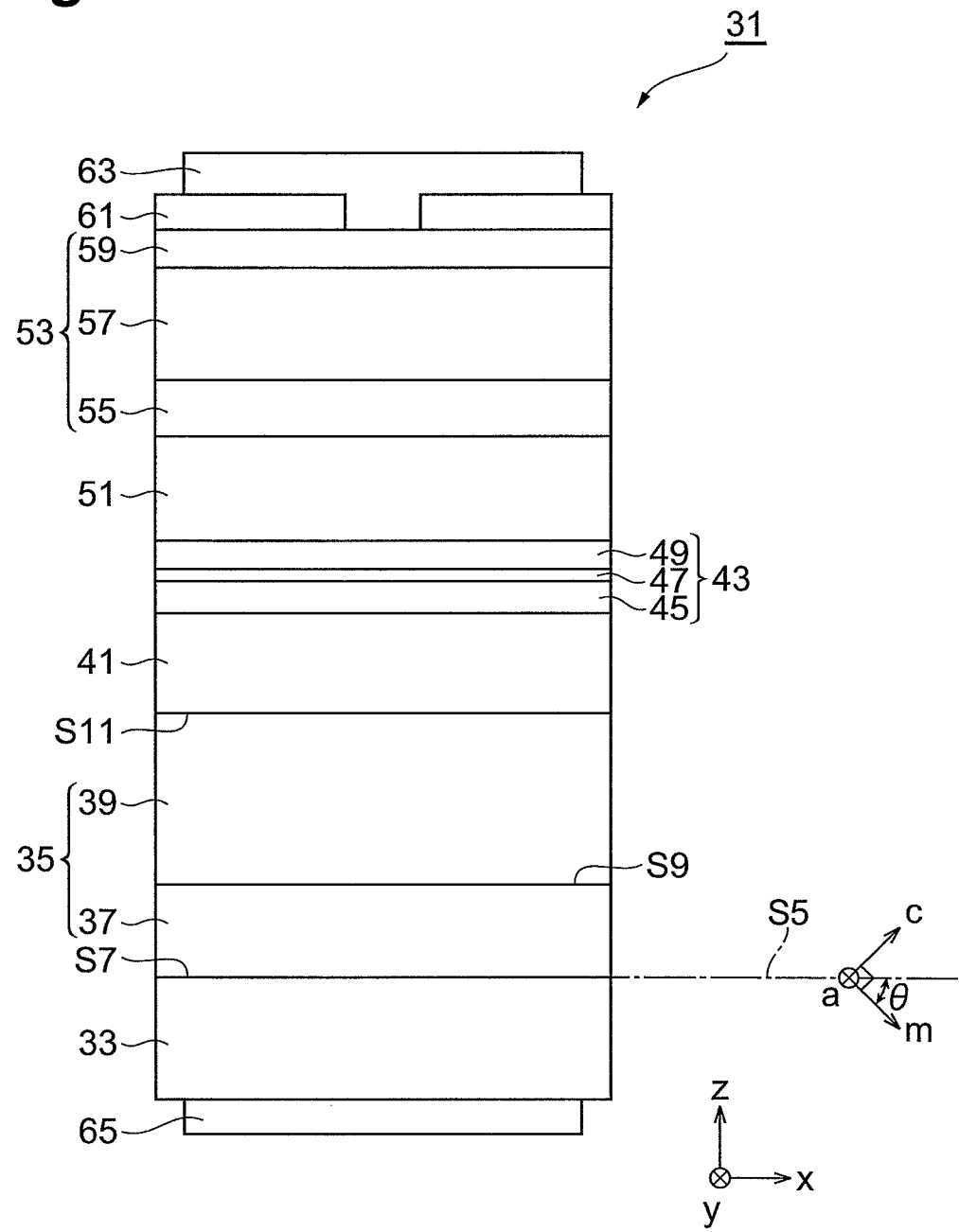
FIG. 3 is a drawing for explaining the structure of the LED according to the embodiment.

FIG. 3 is a drawing schematically showing a configuration of an LD 31 according to the second embodiment. The LD 31 is a laser diode (nitride-based semiconductor light-emitting device) and includes an n-electrode 65, a substrate 33, an n-type gallium nitride-based semiconductor region 35, a guiding layer 41, a light-emitting layer 43, a guiding layer 51, a p-type gallium nitride-based semiconductor region 53, an insulating film 61, and a p-electrode 63 in sequence along the predetermined z-axis. The substrate 33, the n-type gallium nitride-based semiconductor region 35, the guiding layer 41, the light-emitting layer 43, the guiding layer 51, and the p-type gallium nitride-based semiconductor region 53 comprise hexagonal gallium nitride-based semiconductors. A principal surface S7 of the substrate 33 extends along a plane (including the x-axis and y-axis) perpendicular to the z-axis. The principal surface S7 is a semipolar surface extending along a reference plane S5 tilting from a plane perpendicular to the c-axis of the hexagonal gallium nitride-based semiconductor of the substrate 33 at a tilt angle θ in a range of not less than 63 degrees and not more than 80 degrees or in a range of not less than 100 degrees and not more than 117 degrees. FIG. 3 illustrates the c-axis tilting toward the m-axis as an example.

The n-type gallium nitride-based semiconductor region 35 (n-type semiconductor layer 37 in particular) is disposed on the principal surface S7 and is in contact with the principal surface S7 of the substrate 33. The n-type gallium nitride-based semiconductor region 35 includes the n-type semiconductor layer 37 and a cladding layer 39 disposed in sequence in the direction of the z-axis on the principal surface S7 of the substrate 33. The n-type semiconductor layer 37 is disposed between the substrate 33 and the cladding layer 39 and is in contact with both the substrate 33 and the cladding layer 39.

The cladding layer 39 is disposed between the n-type semiconductor layer 37 and the guiding layer 41 and is in contact with both the n-type semiconductor layer 37 and the guiding layer 41. The relation between the lattice constant of the cladding layer 39 and the lattice constant of the substrate 33 may be the same as the relation between the lattice constant of the buffer layer 9 and the lattice constant of the substrate 5 in the LED 1 of the first embodiment described above. A lattice constant of the cladding layer 39 in the direction of a fifth axis (substantially in the direction of the x-axis) may be larger than the lattice constant of the substrate 33 in the direction of an axis (referred to as a second axis similarly defined in the first embodiment) (substantially in the direction of the x-axis). This axis is shared by the principal surface S7 and a plane perpendicular to the principal surface S7 of the substrate 33 and including the c-axis. A lattice constant of the cladding layer 39 in the direction of a sixth axis (substantially in the direction of the y-axis) may be equal to the lattice constant of the substrate 33 in the direction of an axis (referred to as a fourth axis similarly defined in the first embodiment) (substantially in the direction of the y-axis). This axis is perpendicular to the second axis and the c-axis. The fifth axis is shared by an interface S9 at the substrate 33 side of the cladding layer 39 and a surface being perpendicular to the interface S9 and including the c-axis. The sixth axis is perpendicular to the fifth axis and the c-axis. (The term "lattice constant" herein is not inherent in material. Each of the substrate 33 and the cladding layer 39 provided in the LD 31 has its own lattice constant.) Since the cladding layer 39 is lattice-relaxed, the strain is released in the cladding layer 39 to reduce strain generated in a well layer 47. In this case, the cladding layer 39 includes misfit dislocations generated in the interface S9. The misfit dislocations extend in the direction of the sixth axis and have a density in a range of not less than $5\times10^3$ cm$^{-1}$ and not more than $1\times10^5$ cm$^{-1}$.

The guiding layer 41 is disposed between the n-type gallium nitride-based semiconductor region 35 (cladding layer 39 in particular) and the light-emitting layer 43 (barrier layer 45 in particular) and is in contact with both the cladding layer 39 and the light-emitting layer 43. The relation between the lattice constant of the guiding layer 41 and the lattice constant of the substrate 33 is the same as the relation between the lattice constant of the buffer layer 9 and the lattice constant of the substrate 5 of the LED 1 of the first embodiment described above. The light-emitting layer 43 has a single-quantum-well structure. The light-emitting layer 43 includes the barrier layer 45, a well layer 47, and a barrier layer 49 in sequence along the z-axis on the guiding layer 41. The light-emitting layer 43 emits light having a peak wavelength in a range of not less than 450 nm and not more than 600 nm.

The barrier layer 45 is disposed between the guiding layer 41 and the well layer 47 and is in contact with both the guiding layer 41 and the well layer 47. The well layer 47 is disposed between the barrier layer 45 and the barrier layer 49 and is in contact with both the barrier layer 45 and the barrier layer 49. The barrier layer 49 is disposed between the well layer 47 and the guiding layer 51 and is in contact with both the well layer 47 and the guiding layer 51. The guiding layer 51 is disposed between the light-emitting layer 43 (barrier layer 49 in particular) and the p-type gallium nitride-based semiconductor region 53 (electron-blocking layer 55 in particular) and is in contact with both the barrier layer 49 and the electron-blocking layer 55. The difference in band gap energy between barrier layer 45, 49 and the well layer 47 is not less than 0.7 eV. Using the same specifications for the barrier layer 45 and guiding layer 41 or the barrier layer 49 and the guiding layer 51, the guiding layers and the barrier layers may be integrated.

In the case where the principal surface S7 extends along the reference plane S5 tilting from a plane perpendicular to the c-axis of the hexagonal gallium nitride-based semiconductor of the substrate 33 at a tilt angle in a range of not less than 63 degrees and not more than 80 degrees, the piezoelectric polarization generated in the well layer 47 is negative and directed from the p-type gallium nitride-based semiconductor region 53 to the n-type gallium nitride-based semiconductor region 35. In the case of negative piezoelectric polarization in the well layer 47, a greater barrier height to the well layer 47 is provided at the p-type gallium nitride-based semiconductor region 53 side as shown in Part (C) of FIG. 4 compared to the case of positive piezoelectric polarization in the well layer 47 (well structure as shown in Part (A) of FIG. 4) or zero piezoelectric polarization in the well layer 47 (well structure as shown in Part (B) of FIG. 4). Consequently, in a multiple-quantum-well structure having these wells, the efficiency of the electron injection to the well layer is reduced compared to the LD 31 having a single-well structure. Such an effect is enhanced as the barrier height to the well layer at the p-type gallium nitride-based semiconductor region 53 side increases (i.e., the emission wavelength is longer).

The p-type gallium nitride-based semiconductor region 53 includes the electron-blocking layer 55, a cladding layer 57, and a contact layer 59 in sequence in the direction of the z-axis on the guiding layer 51. The electron-blocking layer 55 is disposed between the guiding layer 51 and the contact layer 59 and is in contact with both the guiding layer 51 and the contact layer 59. The cladding layer 57 is disposed between the electron-blocking layer 55 and the contact layer 59 and is in contact with both the electron-blocking layer 55 and the contact layer 59.

The insulating film 61 is disposed on the p-type gallium nitride-based semiconductor region 53 (contact layer 59 in particular) and is in contact with the contact layer 59. The insulating film 61 is provided with a contact hole extending through the insulating film 61 to the surface of the contact layer 59. The p-electrode 63 is disposed on the insulating film 61 and is in contact with the insulating film 61. The p-electrode 63 is in contact with the contact layer 59 through the contact hole of the insulating film 61. The n-electrode 65 is disposed on the surface of the substrate 33 opposite to the principal surface S7, and is in contact with the substrate 33.

An exemplary LD 31 according to the second embodiment is described below. The substrate 33 comprises GaN having a semipolar principal surface S7, while the n-type semiconductor layer 37 comprises n-type doped GaN. The n-type semiconductor layer 37 has a thickness of about 500 nm. The cladding layer 39 comprises n-type doped InAlGaN. An indium composition of the cladding layer 39 is 0.02, an aluminum composition of the cladding layer 39 is 0.09, and a gallium composition of the cladding layer 39 is 0.89. The cladding layer 39 has a thickness of about 1.5 μm.

Each of the guiding layers 41, 51 comprises InGaN and has a thickness of about 200 nm. An indium composition of each of the guiding layers 41, 51 is 0.03, and a gallium composition of each of the guiding layers 41, 51 is 0.97. Each of the barrier layers 45, 49 comprises GaN and has a thickness of about 15 nm. The well layer 47 comprises InGaN and has a thickness of about 3 nm. An indium composition of the well layer 47 is 0.30, and a gallium composition of the well layer 47 is 0.70. The difference in band gap energy between the well layer 47 and the barrier layer 45 or 49 is about 1 eV.

The electron-blocking layer 55 comprises p-type doped AlGaN. An aluminum composition of the electron-blocking layer 55 is 0.12, and a gallium composition of the electron-blocking layer 55 is 0.88. A thickness of the electron-blocking layer 55 is about 20 nm. The cladding layer 57 comprises p-type doped InAlGaN. An indium composition of the cladding layer 57 is 0.02, an aluminum composition of the cladding layer 57 is 0.09, and a gallium composition of the cladding layer 57 is 0.89. The cladding layer 57 has a thickness of about 400 nm.

The contact layer 59 comprises p-type doped GaN. The contact layer 59 has a thickness of about 50 nm. The insulating film 61 comprises, for example, SiO$_2$. The p-electrode 63 comprises a pad electrode and a Ni/Au layer. This pad electrode comprises a Ti/Au layer. The Ti/Au layer is disposed on the surface of the Ni/Au layer. The n-electrode 65 comprises a pad electrode and a Ti/Al layer. This pad electrode comprises a Ti/Au layer. The Ti/Au layer is disposed on the surface of the Ti/Al layer.

A method of making an LD 31 is described below. An LD structure having a band of 520 nm is fabricated on a substrate 33 having a principal surface S7 that is the (20-21) plane tilting off toward the m-axis by 75 degrees. The substrate 33 is kept in an atmosphere of NH$_3$ and H$_2$ at about 1050° C. for about 10 minutes for thermal cleaning to deposit an n-type gallium nitride semiconductor region 37 into a thickness of about 500 nm at about 1050° C. The atmospheric temperature is then reduced to about 840° C. to deposit a cladding layer 39 into a thickness of about 1.5 μm.

Subsequently, a guiding layer 41, a light-emitting layer 43, and a guiding layer 51 are deposited in series. The guiding layers 41, 51 are deposited at a deposition temperature of about 840° C. into a thickness of about 200 nm, barrier layers 45, 49 are deposited at a deposition temperature of about 840° C. into a thickness of about 15 nm, and a well layer 47 is deposited at a deposition temperature of about 740° C. into a thickness of about 3 nm. Subsequently, the atmospheric temperature is increased to about 1000° C. to deposit an electron-blocking layer 55 into a thickness of about 20 nm.

Furthermore, the atmospheric temperature is reduced to about 840° C. again to deposit a cladding layer 57 into a thickness of 400 nm and a contact layer 59 into a thickness of about 50 nm in series. Subsequently, the insulating film 61 is deposited, and a striped window having a width of about 10 µm is formed by wet etching. Subsequently, a p-electrode 63 having a Ni/Au layer and a Ti/Au pad electrode, and an n-electrode 65 having a Ti/Al layer and a Ti/Au pad electrode are made by vapor deposition.

Subsequently, the substrate 33 and an n-type gallium nitride-based semiconductor region 35, the guiding layer 41, the light-emitting layer 43, the guiding layer 51, and a p-type gallium nitride-based semiconductor region 53 deposited on the substrate 33 are cleaved at the pitch of about 800 µm. On the cleaved surface, a dielectric multilayer film of $SiO_2/TiO_2$ is formed to produce a gain guided laser.

As, a comparative example to the exemplary LD 31, a reference LD (a first comparative LD) having a multiple-quantum-well structure including three wells is fabricated. The other configuration of the first comparative LD is the same as that of the exemplary LD 31 except for the configuration of the light-emitting layer. Pulsed electric current is applied to the first comparative LD at a pulse width of 500 nsec and a duty of 0.1%. The exemplary LD 31 has a threshold current of 800 mA, while the first comparative LD has a threshold current of 1100 mA. Both the exemplary LD 31 and the first comparative LD have a lasing wavelength of 520 nm. Since the exemplary LD 31 has only one InGaN well layer (well layer 47) that has a high refractive index, the light confinement of the exemplary LD 31 is less effective compared to the first comparative LD. However, it is believed that the enhanced efficiency of light emission and the higher carrier density per unit well contribute to such a low threshold current.

In addition, as a comparative example to the exemplary LD 31, another reference LD (a second comparative LD) having a single-quantum-well structure including an InGaN guiding layer that has an indium composition of 0.01 and a gallium composition of 0.99 is fabricated. The other configuration of the second comparative LD is the same as that of the exemplary LD 31 except for the configuration of the guiding layer. An observation by transmission electron microscopy (TEM) of a cross-section of the exemplary LD 31 shows a misfit dislocation density of $2 \times 10^4$ $cm^{-1}$ in the interface S11 between the guiding layer 41 and the cladding layer 39 that are at the n-side. No misfit dislocation is observed in the well layer 47. In the second comparative LD, no defect is observed in the interface between a InGaN guiding layer having an indium composition of 0.01 and a gallium composition of 0.99 and a cladding layer having the same configuration as of the cladding layer 39 that are at the n-side, whereas in the light-emitting layer (having the same configuration as that of the light-emitting layer 43), defects at a density of $1 \times 10^8$ $cm^{-2}$ extend from the interface between a well layer (having the same configuration as that of the well layer 47) and the barrier layer (having the same configuration as that of the barrier layer 45, 49) to the surface of a contact layer (having the same configuration as that of the contact layer 59). Since in the exemplary LD 31, strain is relaxed by the guiding layer 41, generation of defects in the light-emitting layer 43 is inhibited even though the well layer 47 has a high indium composition for a longer wavelength. No lasing occurs when current is applied to the second comparative LD. It is believed that lower light-emitting efficiency due to the generation of defects in the light-emitting layer and a low indium composition in the guiding layer cause decreased efficiency of light confinement.

In the LD 31 having such a configuration, since the principal surface S7 of the substrate 33 extends along the reference plane S5 tilting from the plane perpendicular to the c-axis of the hexagonal gallium nitride-based semiconductor substrate 33 at a tilt angle θ in a range of not less than 63 degrees and not more than 80 degrees or in a range of not less than 100 degrees and not more than 117 degrees, piezoelectric polarization generated in the well layer 47 can be reduced compared to a substrate having a principal surface S7 perpendicular to the c-axis. Small piezoelectric polarization generated in the well layer 47 leads to strain of the well structure of the light-emitting layer 43 in the direction that carriers (electrons in particular) barely escape from the well, and the efficiency of the carrier injection (electrons in particular) to the wells decreases in proportion to the number of wells. In contrast, the well layer of the light-emitting layer 43 has a single-quantum-well structure; hence, the efficiency of the carrier injection (electrons in particular) to the well layer is enhanced compared to the multiple-quantum-well structure. Compared to the multiple-quantum-well structure, the injection efficiency of the carriers (electrons in particular) in the light-emitting layer 43 is significantly higher due to a relatively large difference in band gap energy, not less than 0.7 eV, between the well layer 47 and the barrier layer 45 or 49. The light-emitting layer 43 is coherently disposed on the guiding layer 41 that is disposed on the principal surface S7 and lattice-relaxed only in the direction (parallel to the off direction) along the first axis to relax the strain in the well layer 47 of the light-emitting layer 43 and reduce the piezoelectric polarization. In addition, even in large lattice mismatch between the well layer 47 having a high indium composition and the barrier layer 45 or 49, generation of defects in the well layer may be inhibited. Since the misfit dislocations are present in the interface S11 of the guiding layer 41, the misfit dislocations have relatively small influence on properties of the LD 31.

Advantageous effects of the exemplary LED 1 of the first embodiment (abbreviated "exemplary LED" below) are further described below. The exemplary LED has a single-quantum-well structure as described above. As a comparative example to the exemplary LED, a reference LED (a first comparative LED) having a light-emitting layer of a multiple-quantum-well structure including three wells is fabricated. The configuration of the first comparative LED example is the same as that of the exemplary LED except for the light-emitting layer having a multiple-quantum-well structure. The first comparative LED, in common with the exemplary LED, has epitaxial layers including a light-emitting layer on a surface tilting off toward the m-axis of a hexagonal gallium nitride-based semiconductor by 75 degrees. A single-quantum-well structure having one quantum-well layer is referred to as SQW, and a multiple-quantum-well structure having three quantum-well layers is referred to as 3QW below.

Figure 5:
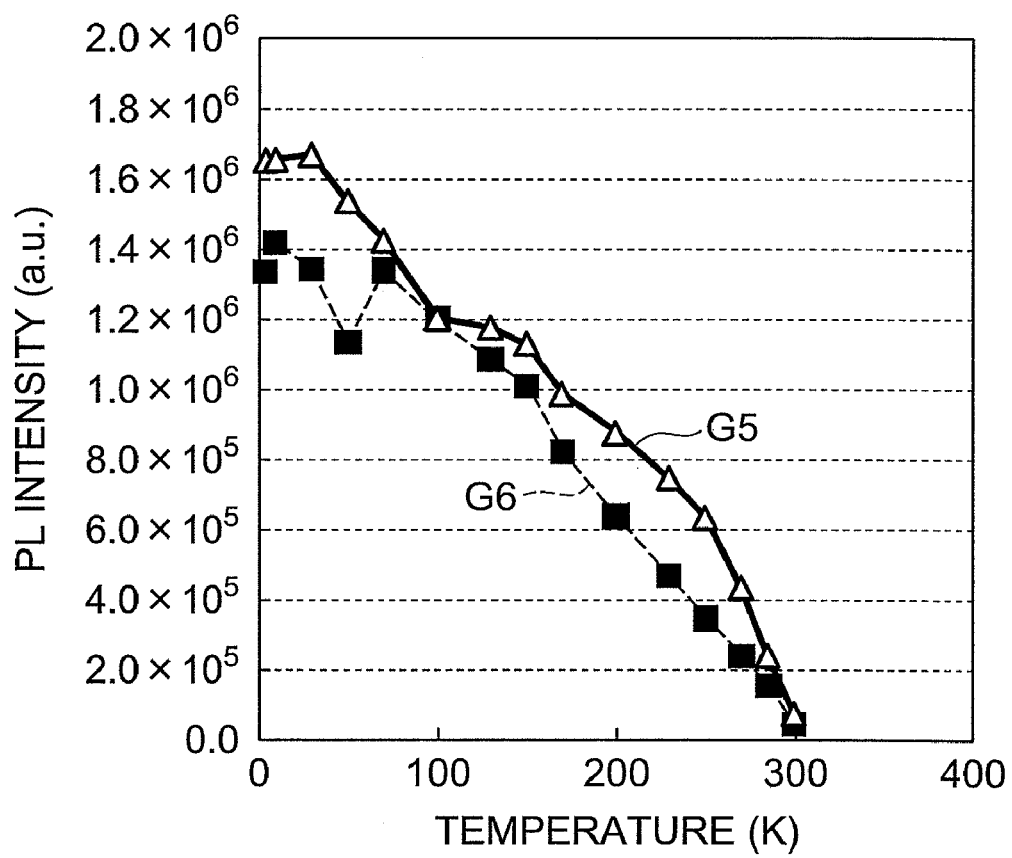
FIG. 5 is a graph showing the dependence of photoluminescence (PL) characteristics on temperature.

The dependence of photoluminescence (PL) characteristics on temperature of the exemplary LED (SQW) and the first comparative LED (3QW) is evaluated. The results are shown in FIG. 5. The graph G5 in FIG. 5 shows the results from the exemplary LED and the graph G6 in FIG. 5 shows the results from the first comparative LED. For the measurement of the PL characteristics shown in FIG. 5, argon second harmonic generation (SHG) laser (wavelength of 244 nm) is used for excitation of carriers in the entire epitaxial layers. Consequently, it is believed that the light-emitting layers have substantially the same density of excited carriers not depending on the number of wells included in the light-emitting layer (either one quantum-well layer of SQW or three quantum-well layers of 3QW). By decreasing temperature, a non-emitting process is inhibited to enhance the PL intensity. For example, at a temperature of not higher than 150 K, the exemplary LED and the first comparative LED have substantially the same PL intensity. This shows that the exemplary LED and the first comparative LED have the respective light-emitting layers of the same luminance efficiency.

Figure 6:
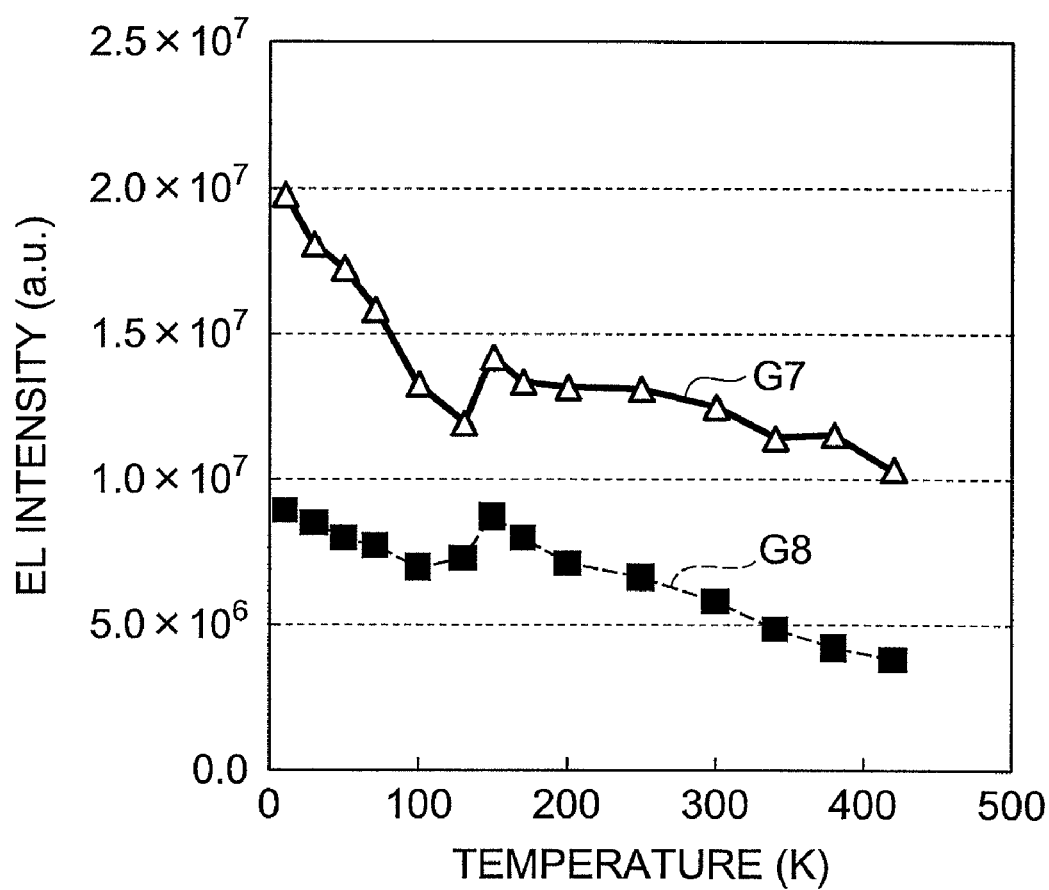
FIG. 6 is a graph showing the dependence of electroluminescence (EL) characteristics on temperature.

The dependence of electroluminescence (EL) characteristics on temperature of the exemplary LED (SQW) and the first comparative LED (3QW) is also evaluated. The results are shown in FIG. 6. The graph G7 in FIG. 6 shows the results from the exemplary LED, and the graph G8 in FIG. 6 shows the results from the first comparative LED. The EL characteristics shown in FIG. 6 are obtained at a current of 2 mA. The exemplary LED (SQW) has higher EL intensity in the entire range of temperature (temperature range of not higher than 500 K) shown in FIG. 6 compared to the first comparative LED. At a relatively low temperature, the exemplary LED and the first comparative LED have substantially the same PL intensity but different EL intensities. Such a difference in EL intensity between the exemplary LED and the first comparative LED suggests that efficiency of carrier injection is different between the exemplary LED and the first comparative LED. Accordingly, the exemplary LED of SQW has more enhanced carrier injection compared to the first comparative LED of 3QW.

Figure 7:
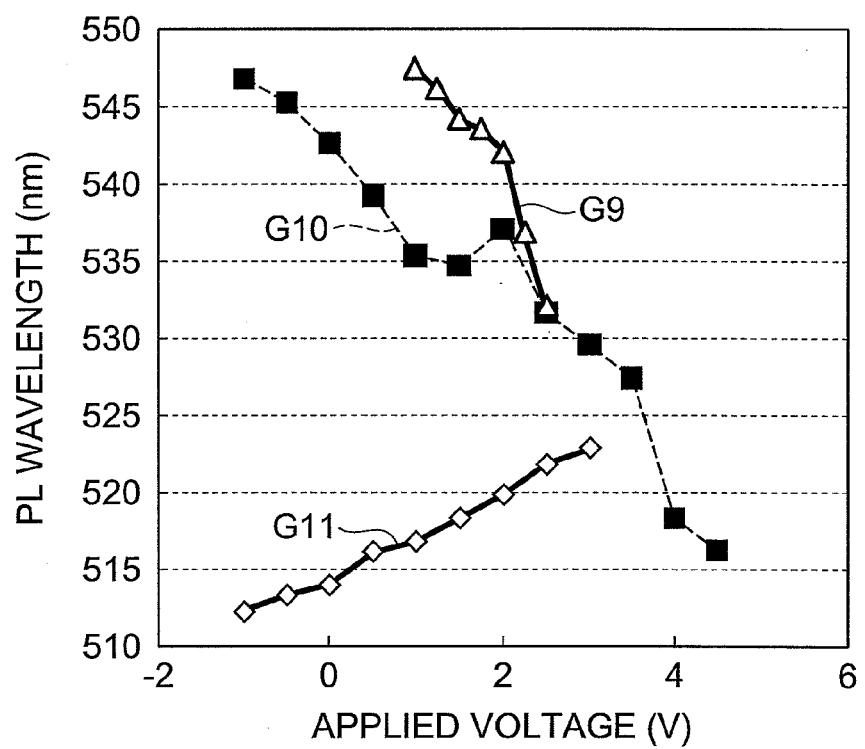
FIG. 7 is a graph showing the dependence of photoluminescence (PL) wavelength on applied voltage.

As a comparative example to the exemplary LED, another reference LED (a second comparative LED) having a light-emitting layer of 3QW disposed on the c-plane of a hexagonal gallium nitride-based semiconductor GaN substrate is further fabricated. The configuration of the second comparative LED is the same as that of the first comparative LED except for the epitaxial layers including light-emitting layer disposed on the c-plane of a gallium nitride-based semiconductor GaN substrate. Photoluminescence (PL) of each of the exemplary LED, the first comparative LED, and the second comparative LED is evaluated under applied bias voltages at a temperature of 100 K to obtain the relation between the direction of piezoelectric polarization and the carrier injection. The obtained results of the dependence of photoluminescence (PL) wavelength on applied voltage for each of the exemplary LED, the first comparative LED, and the second comparative LED are shown in FIG. 7. The graph G9 in FIG. 7 shows the results from the exemplary LED, the graph G10 in FIG. 7 shows the results from the first comparative LED example, and the graph G11 in FIG. 7 shows the results from the second comparative LED example.

The results in FIG. 7 show that with the applied voltage, the second comparative LED exhibits red shift of the PL wavelength, while both the exemplary LED and the first comparative LED exhibit blue shift of the PL wavelength. These results of the PL wavelength correspond to "positive" piezoelectric polarization in the well layer of the second comparative LED and "negative" piezoelectric polarization in that of each of the exemplary LED and the first comparative LED.

Figure 8:
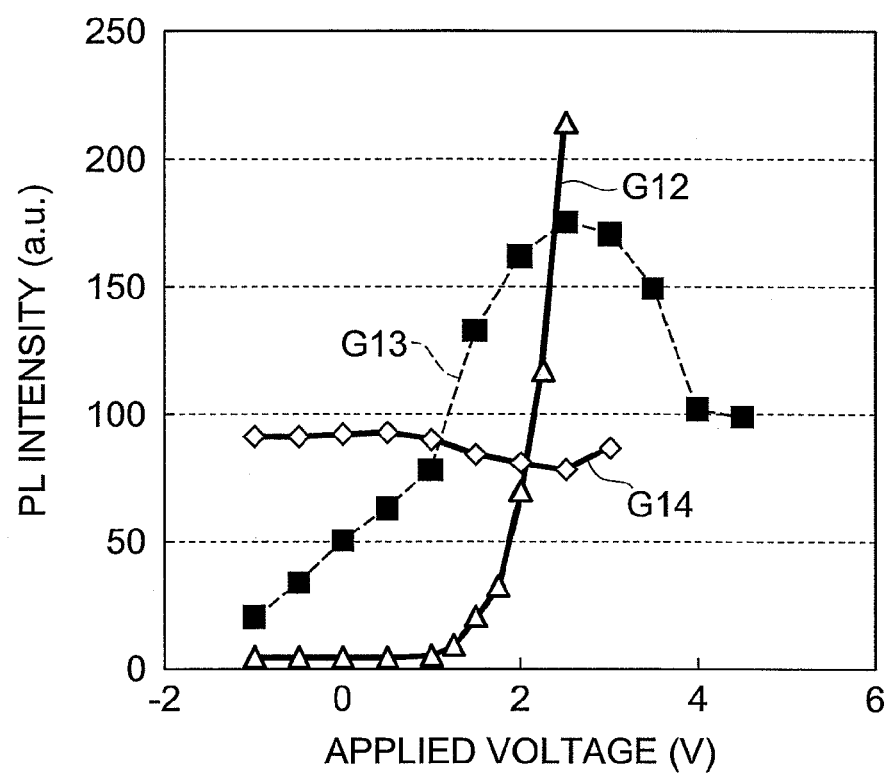
FIG. 8 is a graph showing the dependence of photoluminescence (PL) intensity on applied voltage.

The results in FIG. 8 show the dependence of photoluminescence (PL) intensity on applied voltage of each of the exemplary LED, the first comparative LED, and the second comparative LED. The graph G12 in FIG. 8 shows the results from the exemplary LED, the graph G13 in FIG. 8 shows the results from the first comparative LED, and the graph G14 in FIG. 8 shows the results from the second comparative LED. The results of the PL intensity in FIG. 8 show that, in the relatively low applied voltage range, the second comparative LED exhibits small change in the PL intensity, while both the exemplary LED and the first comparative LED exhibit relatively large decreases in the PL intensity. The exemplary LED of SQW has a more significant relation between the PL intensity and the applied voltage compared to the first comparative LED of 3QW.

The reason for the results shown in FIG. 7 and FIG. 8 is described below with reference to FIG. 9. An electron in a well layer is attracted toward the n-side in inverse proportion to the applied voltage. An LED such as the second comparative LED having epitaxial layers including a light-emitting layer disposed on the c-plane of a hexagonal gallium nitride-based semiconductor GaN substrate has "positive" piezoelectric polarization in the well layer to bend the band as shown in Part (A) of FIG. 9. Consequently, a trapped electron E1 in a well layer Q1 included in the band barely escapes toward the n-side. In the well layer Q1 shown in Part (A) of FIG. 9, the barrier height at the n-side for the electron E1 (the barrier height at the n-side in the well layer Q1 is a relative value V2 to the energy level V1 in the well layer Q1) is higher than the barrier height at the p-side for the electron E1 (the barrier height at the p-side in the well layer Q1 is a relative value V3 to the energy level V1 in the well layer Q1). Consequently, it is believed that the second comparative LED has a high PL intensity even in the range of relatively low applied voltage.

Figure 9:
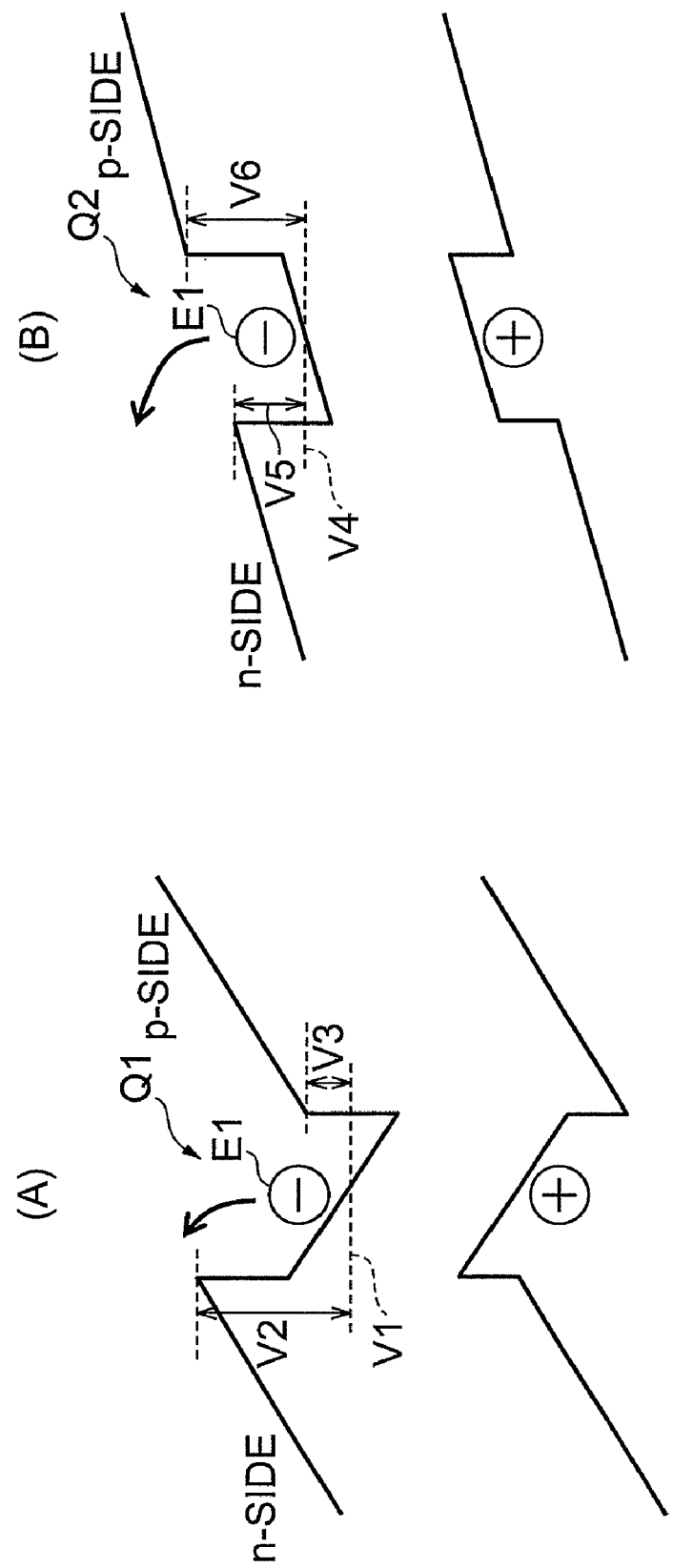
FIG. 9 is a drawing for explaining the results shown in FIG. 7 and FIG. 8.

In contrast, an LED such as the exemplary LED or the first comparative LED having epitaxial layers including a light-emitting layer disposed on a surface tilting toward the m-axis of a hexagonal gallium nitride-based semiconductor by 75 degrees has "negative" piezoelectric polarization in the well layer to bend the band as shown in Part (B) of FIG. 9. Consequently, a trapped electron E1 in a well layer Q2 included in the band tends to escape toward the n-side. In the well layer Q2 shown in Part (B) of FIG. 9, the barrier height at the n-side for the electron E1 (the barrier height at the n-side in the well layer Q2 is a relative value V5 to the energy level V4 in the well layer Q2) is higher than the barrier height at the p-side for the electron E1 (the barrier height at the p-side in the well layer Q2 is a relative value V6 to the energy level V4 in the well layer Q2). Consequently, it is believed that the exemplary LED and the first comparative LED exhibit decreases in PL intensity in the range of low applied voltage. It is believed that, in particular, the exemplary LED of SQW exhibits the drastic decrease in PL intensity, because an electron escaping toward the n-side is not trapped again in an adjacent well layer.

Since the electron is moved toward the p-side in electroluminescence (EL) under forward bias, the resulting phenomenon described below is different from that of EL in the range of low applied voltage described above. In an LED having epitaxial layers including a light-emitting layer on a surface tilting off toward the m-axis of a hexagonal gallium nitride-based semiconductor by 75 degrees, the electron barely escapes toward the p-side. Since the first comparative LED has epitaxial layers including a light-emitting layer on a surface tilting off toward the m-axis of a hexagonal gallium nitride-based semiconductor by 75 degrees, and has a plurality of well layers, the distribution of the injected electron densities is inhomogeneous among the respective well layers. Consequently, the exemplary LED has more advantageous effects such as enhanced luminescence efficiency and reduced voltage compared to the first comparative LED.

Figure 10:
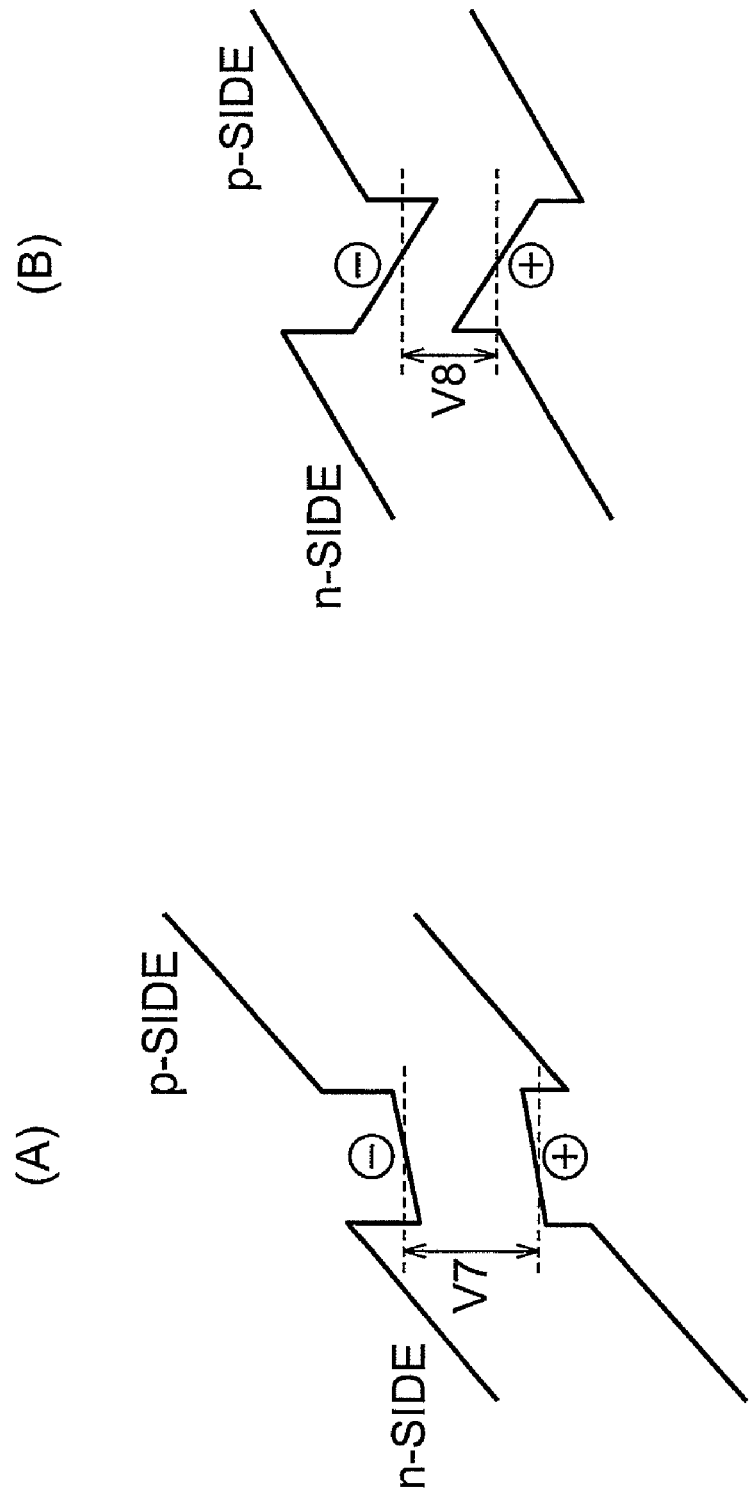
FIG. 10 is a drawing for explaining a method of determination of the direction of the piezoelectric polarization in a well layer.
Figure 11:
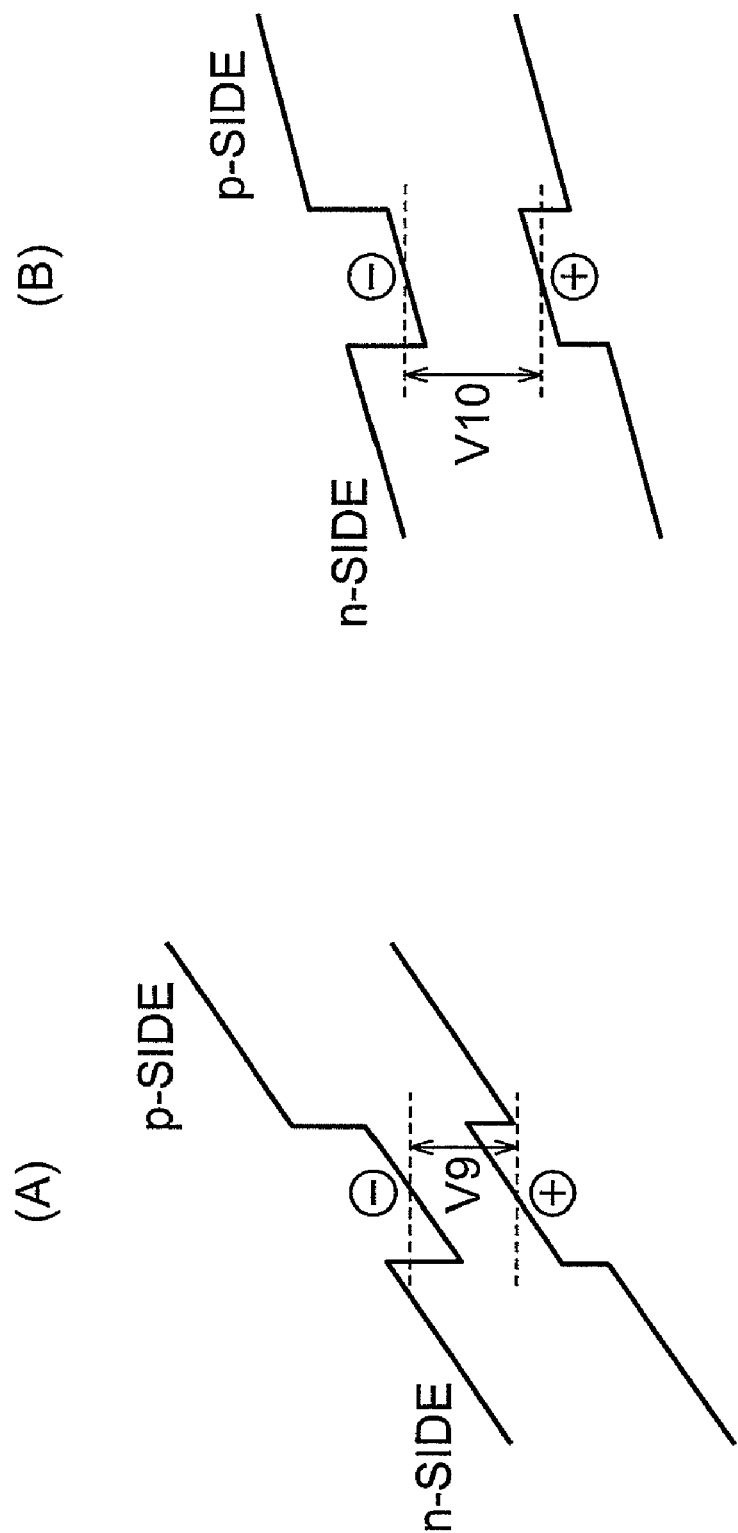
FIG. 11 is a drawing for explaining a method of determination of the direction of the piezoelectric polarization in a well layer.

With reference to FIG. 10 and FIG. 11, a method of determination of the direction of piezoelectric polarization (internal electric field including spontaneous polarization, to be exact) in a well layer is described below. For the exemplary LED and the comparative LED in the first embodiment, the direction of piezoelectric polarization is determined by biased photoluminescence (PL). The biased photoluminescence (PL) is a method of detecting PL by applying external voltage to the exemplary LED, the first comparative LED, or the second comparative LED and irradiating excitation light onto the Ni/Au electrode (e.g. p-electrode 25). In the case of substantially "positive" piezoelectric polarization in the well layer, forward bias leads to a red shift because the energy gap V7 shown in Part (A) of FIG. 10 is reduced to the energy gap V8 that is smaller than the energy gap V7 as shown in Part (B) of FIG. 10 (energy gap V7>energy gap V8). As a result, through observation of the red shift for the forward bias, the piezoelectric polarization in the well layer can be determined as "positive". In the case of substantially "negative" piezoelectric polarization in the well layer, forward bias leads to a blue shift because the energy gap V9 shown in Part (A) of FIG. 11 is increased to the energy gap V10 that is larger than the energy gap V9 as shown in Part (B) of FIG. 11 (energy gap V9<energy gap V10). As a result, through observation of the blue shift for the forward bias, the piezoelectric polarization in the well layer can be determined as "negative".

Figure 12:
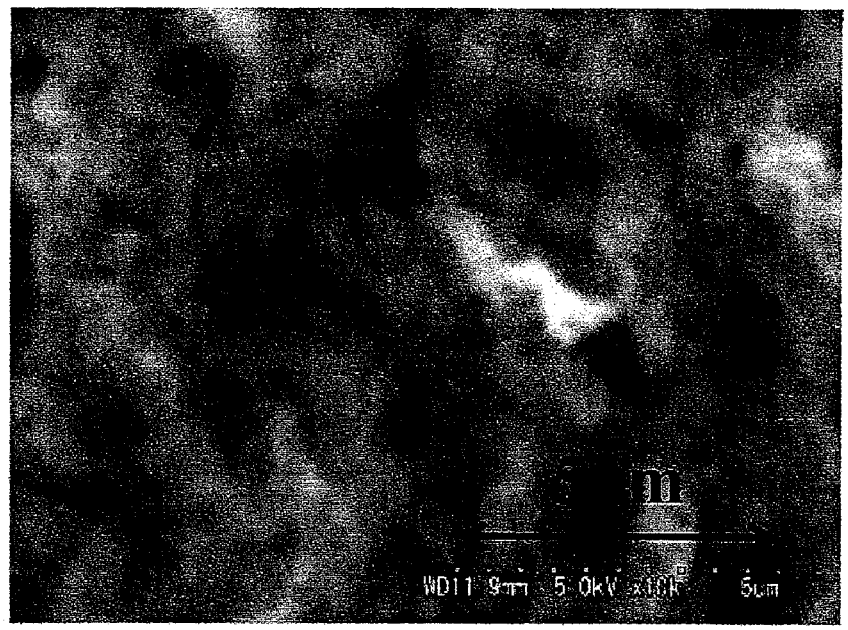
FIG. 12 is a drawing showing the results of cathodoluminescence (CL) observation.
Figure 13:
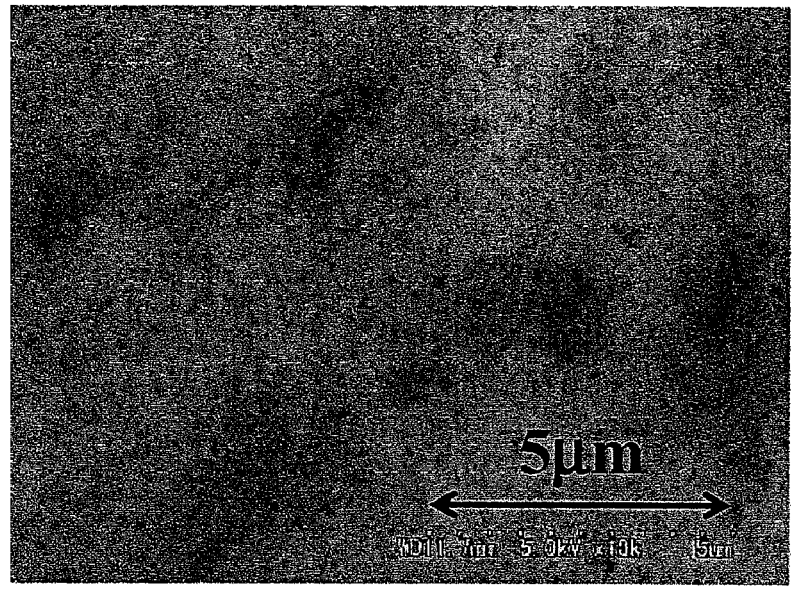
FIG. 13 is a drawing showing the results of cathodoluminescence (CL) observation.

Subsequently, an LED having epitaxial layers including a light-emitting layer of SQW disposed on the c-plane of a sapphire substrate (a third comparative LED emitting light having a wavelength in 470 nm band), and another LED having epitaxial layers including a light-emitting layer of 3QW disposed on the c-plane of a sapphire substrate (a fourth comparative LED emitting light having a wavelength in 470 nm band), are fabricated to observe cathodoluminescence (CL) of each of the third comparative LED, the fourth comparative LED, and the exemplary LED. FIG. 12 illustrates the results of observed cathodoluminescence (CL) of the third comparative LED; FIG. 13 illustrates the results of observed cathodoluminescence (CL) of the fourth comparative LED; and FIG. 14 illustrates the results of observed cathodoluminescence (CL) of the exemplary LED.

The results of observed cathodoluminescence (CL) of the fourth comparative LED of 3QW in FIG. 13 show relatively homogeneous luminescence, while the results of observed cathodoluminescence (CL) of the third comparative LED of SQW in FIG. 12 show non-luminous regions. An InGaN well layer disposed on the c-plane has difficulty in achieving a homogeneous indium composition or a uniform thickness of deposition. Accordingly, due to the inhomogeneous distribution of strain in the c-plane, non-luminous regions increase. It is believed that the third comparative LED of SQW has non-luminous regions from these reasons.

In contrast, the fourth comparative LED of 3QW has relatively uniform luminescence due to a buffering effect of a plurality of well layers with each other for remedy of the inhomogeneous luminescence, even though the epitaxial layers including a light-emitting layer are disposed on the c-plane, like the third comparative LED. It is believed that the fourth comparative LED of 3QW produces relatively homogeneous luminescence from these reasons.

Figure 14:
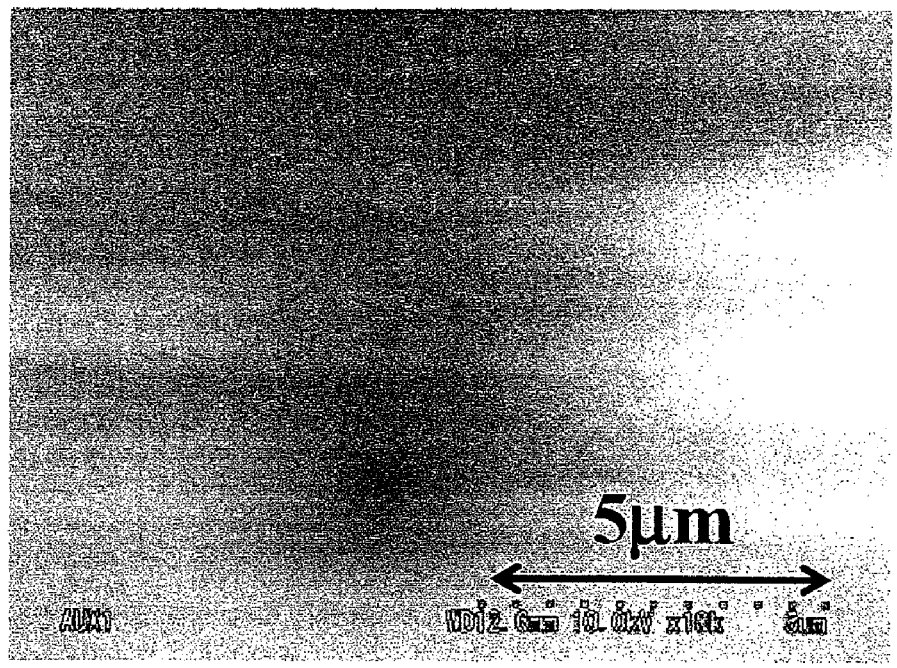
FIG. 14 is a drawing showing the results of cathodoluminescence (CL) observation.

In contrast, the results of cathodoluminescence (CL) observation of the exemplary LED of SQW in FIG. 14 show homogeneous luminescence. The exemplary LED has epitaxial layers including a light-emitting layer of SQW disposed on a surface tilting off toward the m-axis of a hexagonal gallium nitride-based semiconductor by 75 degrees. It is believed that since such an InGaN well layer deposited on a surface tilting off toward the m-axis of a hexagonal gallium nitride-based semiconductor by 75 degrees has a relatively homogeneous crystal structure, the exemplary LED has relatively homogeneous luminescence. Accordingly, the advantageous effect of SQW of the exemplary LED in the first embodiment is particularly remarkable in a plane orientation and depositing condition that enable the InGaN well layer to deposit homogeneously. A principal surface of the substrate tilting from a plane perpendicular to the c-axis in a range of not less than 63 degrees and not more than 80 degrees or in a range of not less than 100 degrees and not more than 117 degrees tends to readily incorporate indium to produce an InGaN well layer having excellent homogeneity.

The principle of the present invention has been illustrated in the preferred embodiments with reference to the attached drawings. Those skilled in the art will appreciate that the configurations and the details can be modified without departing from the principal of the invention. The present invention is not limited to the specific configurations disclosed in the embodiments. Accordingly, it is to be understood that, the present invention encompasses all changes and modifications without departing from the spirit of the invention as defined in the appended claims.

INDUSTRIAL APPLICABILITY

As described above, a nitride-based semiconductor light-emitting device having enhanced efficiency of carrier injection to a well layer is provided in accordance with the embodiment of the present invention.

REFERENCE SIGNS LIST

1: LED; 11, 43: light-emitting layers; 13, 17, 45, 49: barrier layers; 15, 47: well layers; 19: p-type gallium nitride-based semiconductor region; 21, 55: electron-blocking layers; 23, 59: contact layers 25, 63: p-electrodes; 27: pad electrode; 29, 65: n-electrodes; 31: LD; 33, 5: substrates; 35: n-type gallium nitride-based semiconductor region; 37: n-type semiconductor layer; 39, 57: cladding layers; 41, 51: guiding layers; 53: p-type gallium nitride-based semiconductor region; 61: insulating film; 7: n-type gallium nitride-based semiconductor region; 9: buffer layer; S1, S7: principal surfaces; S11, S3, S9: interfaces; S5: reference plane.

The invention claimed is:
1. A nitride-based semiconductor light-emitting device comprising:
a substrate of hexagonal gallium nitride-based semiconductor;
an n-type gallium nitride-based semiconductor region disposed on a principal surface of the substrate;
a light-emitting layer having a single-quantum-well structure disposed on the n-type gallium nitride-based semiconductor region; and
a p-type gallium nitride-based semiconductor region disposed on the light-emitting layer,
the light-emitting layer being disposed between the n-type gallium nitride-based semiconductor region and the p-type gallium nitride-based semiconductor region,
the light-emitting layer including a well layer and a barrier layer,
the well layer comprising InGaN,
the principal surface extending along a reference plane tilting from a plane perpendicular to a c-axis of the hexagonal gallium nitride-based semiconductor at a tilt angle in a range of not less than 63 degrees and not more than 80 degrees or in a range of not less than 100 degrees and not more than 117 degrees, and
an InGaN layer,
wherein the InGaN layer is disposed between the n-type gallium nitride-based semiconductor region and the light-emitting layer, wherein a lattice constant of the InGaN layer in the direction of a first axis is larger than a lattice constant of the substrate in the direction of a second axis wherein a lattice constant of the InGaN layer in the direction of a third axis is equal to a lattice constant of the substrate in the direction of a fourth axis, wherein the first axis is shared by a first interface at the substrate side of the InGaN layer and a surface being perpendicular to the first interface and including the c-axis, wherein the second axis is shared by the principal surface and a surface being perpendicular to the principal surface and including the c-axis, wherein the third axis is perpendicular to the first axis and the c-axis, wherein the fourth axis is perpendicular to the second axis and the c-axis.

2. The nitride-based semiconductor light-emitting device according to claim 1, wherein the direction of a piezoelectric polarization generated in the well layer is identical to the direction from the p-type gallium nitride-based semiconductor region to the n-type gallium nitride-based semiconductor region.

3. The nitride-based semiconductor light-emitting device according to claim 1, wherein the difference in band gap energy between the barrier layer and the well layer is not less than 0.7 eV.

4. The nitride-based semiconductor light-emitting device according to claim 1, wherein the light-emitting layer emits light having a peak wavelength in a range of not less than 450 nm and not more than 600 nm.

5. The nitride-based semiconductor light-emitting device according to claim 1, wherein the InGaN layer includes misfit dislocations generated in the first interface, the misfit dislocations extending along the third axis and having a density in a range of not less than $5\times10^3$ cm$^{-1}$ and not more than $1\times10^5$ cm$^{-1}$.

6. The nitride-based semiconductor light-emitting device according to claim 1, wherein the n-type gallium nitride-based semiconductor region includes an n-type InAlGaN layer, wherein a lattice constant of the InAlGaN layer in the direction of a fifth axis is larger than the lattice constant of the substrate in the direction of the second axis, wherein a lattice constant of the InAlGaN layer in the direction of a sixth axis is equal to the lattice constant of the substrate in the direction of the fourth axis, wherein the fifth axis is shared by a second interface at the substrate side of the InAlGaN layer and a surface being perpendicular to the second interface and including the c-axis, wherein the sixth axis is perpendicular to the fifth axis and the c-axis.

7. The nitride-based semiconductor light-emitting device according to claim 6, wherein the InAlGaN layer includes misfit dislocations generated in the second interface, the misfit dislocations extending along the sixth axis and having a density in a range of not less than $5\times10^3$ cm$^{-1}$ and not more than $1\times10^5$ cm$^{-1}$.

* * * * *